(12) United States Patent
Waitl et al.

(10) Patent No.: US 6,432,745 B1
(45) Date of Patent: Aug. 13, 2002

(54) TWO-POLE SMT MINIATURE HOUSING FOR SEMICONDUCTOR COMPONENTS AND METHOD FOR THE MANUFACTURE THEREOF

(75) Inventors: Guenther Waitl; Franz Schellhorn; Herbert Brunner, all of Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 1290 days.

(21) Appl. No.: 08/866,064

(22) Filed: May 30, 1997

Related U.S. Application Data

(63) Continuation of application No. 08/681,599, filed on Jul. 26, 1996, now abandoned, which is a continuation of application No. 08/316,247, filed on Sep. 30, 1994, now abandoned.

(30) Foreign Application Priority Data

Sep. 30, 1993 (DE) .......................... 43 33 392

(51) Int. Cl.[7] .................. H01L 21/44; H01L 21/48; H01L 21/50
(52) U.S. Cl. .................. 438/116; 438/123; 438/124
(58) Field of Search .................. 438/116, 123, 438/124

(56) References Cited

U.S. PATENT DOCUMENTS

| | | | | |
|---|---|---|---|---|
| 4,478,588 A | * | 10/1984 | Lockard | 437/906 |
| 4,660,127 A | * | 4/1987 | Gunter | 437/217 |
| 4,941,067 A | * | 7/1990 | Craft | 361/386 |
| 4,945,398 A | * | 7/1990 | Kurita et al. | 257/696 |
| 5,040,868 A | * | 8/1991 | Waitl et al. | 358/33 |
| 5,043,791 A | * | 8/1991 | Stokes et al. | 357/70 |
| 5,049,527 A | * | 9/1991 | Merrick et al. | 437/220 |
| 5,070,039 A | * | 12/1991 | Johnson et al. | 437/220 |
| 5,224,021 A | * | 6/1993 | Takada et al. | 257/696 |

FOREIGN PATENT DOCUMENTS

| | | | |
|---|---|---|---|
| JP | 5368922 | * | 6/1978 |
| JP | 62263663 | * | 11/1987 |
| JP | 62263667 | * | 11/1987 |
| JP | 6352455 | * | 3/1988 |
| JP | 2156558 | * | 6/1990 |
| JP | 3250657 | * | 11/1991 |
| JP | 462942 | * | 2/1992 |
| JP | 4128811 | * | 4/1992 |
| JP | 4139732 | * | 5/1992 |

OTHER PUBLICATIONS

Japanese Abstract JP4128811—Iwashima Osamu—Photo-electric Conversion DevicePage 01/01.

* cited by examiner

*Primary Examiner*—David E. Graybill
(74) *Attorney, Agent, or Firm*—Schiff Hardin & Waite

(57) ABSTRACT

In a two-pole SMT miniature housing in leadframe technique for semiconductor components, a semiconductor chip is mounted on one leadframe part and is contacted to a further leadframe part. The further leadframe part is conducted out of the housing in which the chip is encapsulated as a solder terminal. No trimming or shaping process is required and the housing is tight and is capable of further miniaturization. The solder terminals as punched parts of the leadframe are conducted projecting laterally from the housing sidewalls residing opposite one another at least up to the housing floor which forms the components' mounting surface. The chip mounting surface and the components' mounting surface form a right angle with one another.

8 Claims, 1 Drawing Sheet

TWO-POLE SMT MINIATURE HOUSING FOR SEMICONDUCTOR COMPONENTS AND METHOD FOR THE MANUFACTURE THEREOF

This is a continuation of application Ser. No. 08/316,247, filed Sep. 20, 1994, abandoned.

This is a continuation of application Ser. No. 08/681,599, filed Jul. 26, 1996, abandoned.

BACKGROUND OF THE INVENTION

The invention is directed to a two-pole SMT (surface mount technology) miniature housing in leadframe technique for a semiconductor component, whereby a semiconductor chip encapsulated in a housing is mounted on a leadframe part and is contacted to another leadframe part which is conducted out of the housing as a solder terminal.

In known SMT housings in leadframe technique, for example given a SOD 123 housing, the solder terminals for the semiconductor component must be punched free and bent in a specific way after the encapsulation of the semiconductor component which, for example, occurs by casting, extruding or extrusion coating. This trimming and shaping process is necessary in order to guide the solder terminals past the housing such that such SMDs (surface mounted devices) can be mounted on a printed circuit board or mother board. The chip mounting area on the leadframe in the mounted condition thereby proceeds parallel to the PCB (printed circuit board), or to the mother board.

SUMMARY OF THE INVENTION

It is an object of the invention to create a SMT miniature housing for a semiconductor component that can be easily manufactured without such a trimming and shaping process, that is reliably tight and can also be further miniaturized, and that is distinguished by a high heat elimination.

In a two-pole SMT miniature housing of the type initially cited, this object is achieved in that the solder terminals, as punched parts of the leadframe, project laterally from housing sidewalls lying opposite one another at least up to the housing floor that forms the components' mounting surface, whereby the chip mounting surface and the components' mounting surface form a right angle relative to one another.

Advantageously, the solder terminals have a thickness of approximately 0.2 mm–0.5 mm. The SMT miniature housing is especially suited for optoelectronic semiconductor components, particularly for optosemiconductors that receive or transmit optical radiation at the side, referred to as sidelookers.

The two-pole SMT miniature housing is manufactured according to the invention such that leadframe parts serving as finished solder terminals in a leadframe are fabricated by punching, and such that the semiconductor chip is then mounted on the one leadframe part and is contacted to the other leadframe part. The semiconductor chip is encapsulated in a housing by casting, extrusion or extrusion-coating such that the right-angled legs of the finished solder terminals at two outsides of the housing lying opposite one another are conducted at least up to the floor or mounting surface thereof. The finished SMT miniature housing then only has to be punched free from the leadframe. Components manufactured in this technique are then, for example, soldered onto a PCB such that the chip mounting surface resides perpendicularly relative to the PCB.

The advantages achieved with the invention are particularly comprised in that the manufacturing step of trimming and shaping the solder terminals is eliminated in the manufacture of the SMT miniature housing and is integrated in the punching process for shaping the leadframe. The solder terminals—in their punched form as finished component parts—then only have to be punched free from the lead frame. Resulting therefrom is that bending stress is no longer exerted on the component and, for example, the occurrence of micro-cracks is prevented. Fewer deviations from the tolerances in the finished housing also occur since a bending of the solder terminals is no longer necessary. The dimensional accuracy of the solder terminals is thus especially improved. A corresponding leadframe shaping also makes it possible to avoid a deflashing of the terminals after their encapsulation. In particular, the dissipated power of the components can be increased by employing thicker leadframes than in known housings. Moreover, due to the improved arrangement of chip and leadframe or solder terminals, the housing can be further miniaturized.

DESCRIPTION OF THE PREFERRED EMBODIMENTS

Figure 1:
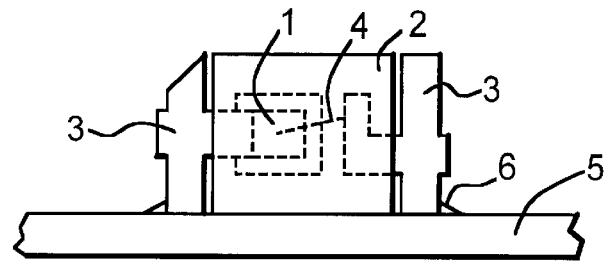
FIG. 1 shows a SMT miniature housing in a side view.
Figure 2:
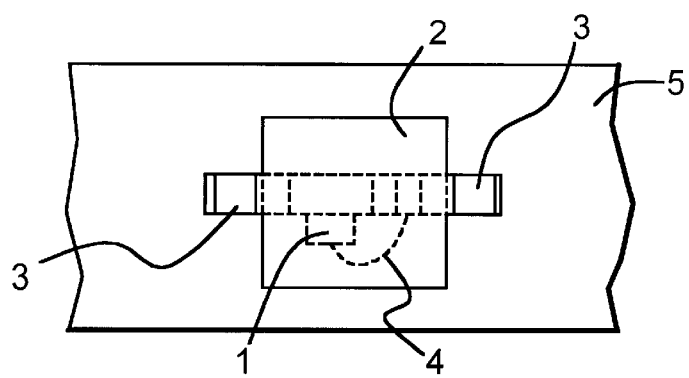
FIG. 2 is a plan view onto the housing of FIG. 1.

The two-pole SMT miniature housing shown in FIGS. 1 and 2 is manufactured in a leadframe technique. A semiconductor chip is thereby mounted on a leadframe part and is contacted to a further leadframe part with a wire 4. The two leadframe parts are conducted out of the housing 2 as solder terminals 3; for example, an IRED, LED or photodiode is encapsulated in the housing 2 as chip 1. The two solder terminals 3 are punched as finished solder terminals 3 from the leadframe having the desired contours in a punching process, and therefore need no longer be shaped afterwards. After the punching process, the semiconductor chip 1 is mounted on the one leadframe part or solder terminal 3, and is then encapsulated in plastic by casting, extruding or extrusion coating. The two solder terminals 3, as punched parts of the leadframe, are thereby conducted at least up to the floor of the housing 2 that forms the components' mounting surface, and project outwardly from housing sidewalls that reside opposite one another. The chip mounting surface and the components' mounting surface or bottom surface of the housing 2 thereby describe a right angle relative to one another. The finished SMT miniature housing is then soldered onto a mother board or printed circuit board 5 such that the chip mounting surface or the surface erected by the leadframe resides perpendicularly relative to the printed circuit board 5 or relative to the PCB.

Figure 3:
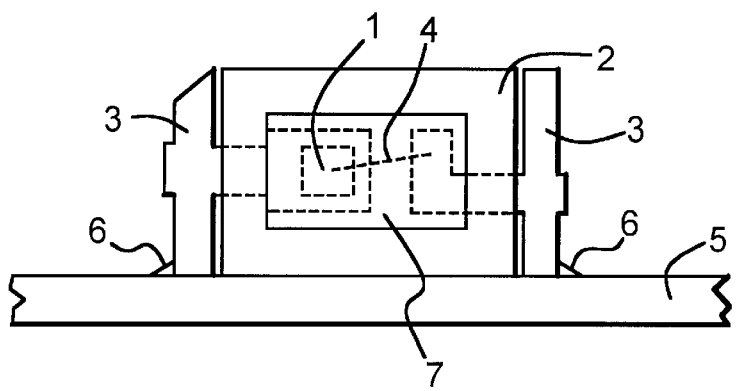
FIG. 3 is another SMT miniature housing in a side view.
Figure 4:
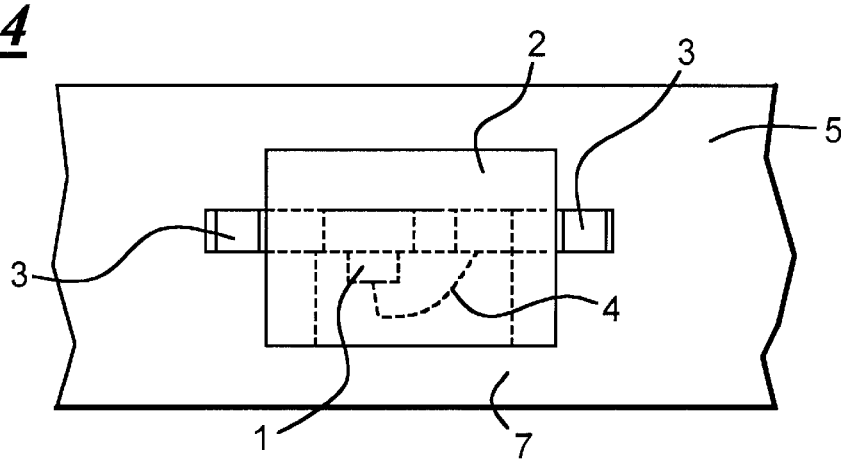
FIG. 4 is a plan view onto the housing of FIG. 3.

The two-pole SMT miniature housing shown in FIGS. 3 and 4 is employed for optoelectronic semiconductor components having side-looking emission or reception characteristics. Such components are also referred to as sidelookers. The SMT-compatible housing is composed of the two leadframe parts that form the solder terminals 3 and that are punched from the lead frame in the desired shape. An optosemiconductor is mounted on the one leadframe part as a semiconductor chip, and is contacted to the second leadframe part or solder terminal part 3 via a bond wire 4. The chip mounting can thereby also occur on a pre-housed leadframe. In this exemplary embodiment, a space serving as reflector 7 is recessed in the housing 2, the chip 1 being cast out therein with a transparent casting resin after the mounting so that the desired sidelooker is produced. The chip mounting surface and the component's mounting surface again form a right angle with one another. The finished product, for example, can then be soldered onto a PCB or onto a printed circuit board 5 such that the chip mounting surface resides perpendicularly on the surface that is formed by the printed circuit board 5. The soldering of the SMT miniature housing to a printed circuit board 5 is indicated with the solder meniscus 6 in FIGS. 1 and 3.

Although various minor changes and modifications might be proposed by those skilled in the art, it will be understood that we wish to include within the scope of the patent warranted hereon all such changes and modifications as reasonably come within our contribution to the art.

We claim as our invention:

1. A two-pole surface mount technology (SMT) miniature housing in lead frame technique for a semiconductor component and which is mountable on a printed circuit board having a flat surface, comprising:

a housing having a surface facing the printed circuit board all of which is flat, all of which is parallel to, and all of which is in contact with the printed circuit board so as to form a planar component mounting surface;

a semiconductor chip encapsulated in the housing;

a first lead frame part having the semiconductor chip mounted thereon at a chip mounting surface thereof and a second lead frame part contacted to the chip, both lead frame parts being conducted out of the housing;

the first and second lead frame parts each forming solder terminals alongside the housing, a width of the planar mounting surface being greater than a thickness of the solder terminals;

said solder terminals being formed as punched parts and which are finished solder terminals not requiring further length change and which run alongside and laterally project outwardly from sidewalls of the housing at opposite sides of the housing, said solder terminals extending vertically downwardly to a position level with and having unbent ends terminating at and even with the planar component mounting surface of the bottom of the housing so that the solder terminals can be soldered to the printed circuit board at a top surface thereof, said first and second lead frame parts with their solder terminals having no portions which are mechanically bent and thus have no bending stresses at any portions thereof; and said chip mounting surface and said planar component mounting surface formed by said housing floor being at right angles with respect to one another.

2. A housing according to claim 1 wherein the solder terminals have a thickness of approximately 0.2 mm–0.5 mm for dissipating power of the semiconductor component.

3. A housing according to claim 2 wherein the semiconductor component comprises an optoelectronic component.

4. A housing according to claim 3 wherein said housing has a space as a reflector.

5. A housing according to claim 4 wherein the semiconductor component is a laterally light receiving optoelectronic component.

6. A housing according to claim 4 wherein the semiconductor component is a laterally light transmitting optoelectronic component.

7. A surface mount technology component system, comprising:

a printed circuit board having a flat surface and a surface mount technology component on said flat surface;

a housing of the component having a surface facing the printed circuit board all of which is flat, all of which is parallel to, and all of which is in contact with the printed circuit board so as to form a planar component mounting surface;

a semiconductor chip encapsulated in the housing;

first and second lead frame parts contacted to the semiconductor chip, at least one of said lead frame parts being directly mounted to the semiconductor chip at a flat mounting surface thereof;

said first and second lead frame parts being conducted out of said housing and forming solder terminals extending along opposite sides of the housing and outwardly from the housing, a width of the flat mounting surface being greater than a thickness of the solder terminals, said solder terminals having unbent ends terminating level with said housing flat mounting surface where they contact the printed circuit board and comprising finished solder terminals which do not require any further length change, the solder terminals being soldered to the printed circuit board at a top surface thereof;

said first and second lead frame parts being planar throughout their extent and comprising punched parts having no mechanically bent portions and thus no bending stresses at any portions thereof;

the mounting surface of the chip being at right angles to said housing mounting surface; and planar surfaces of said solder terminals being at right angles to said housing mounting surface.

8. A surface mount technology component according to claim 7 wherein said solder terminals have a thickness of approximately between 0.3 mm–0.5 mm for dissipating power of the semiconductor component.

* * * * *